US008179336B2

(12) United States Patent
Hamer et al.

(10) Patent No.: US 8,179,336 B2
(45) Date of Patent: May 15, 2012

(54) TILED ELECTRONIC DISPLAY

(75) Inventors: John W. Hamer, Rochester, NY (US);
Dustin L. Winters, Webster, NY (US)

(73) Assignee: Global OLED Technology, LLC.,
Wilmington, DE (US)

( * ) Notice: Subject to any disclaimer, the term of this patent is extended or adjusted under 35 U.S.C. 154(b) by 904 days.

(21) Appl. No.: 12/164,295

(22) Filed: Jun. 30, 2008

(65) Prior Publication Data

US 2009/0322649 A1 Dec. 31, 2009

(51) Int. Cl.
*G09G 5/00* (2006.01)
*G09G 3/36* (2006.01)
(52) U.S. Cl. .......................... 345/1.3; 345/98
(58) Field of Classification Search .................. 345/1.3, 345/76–90, 103
See application file for complete search history.

(56) References Cited

U.S. PATENT DOCUMENTS

| | | | |
|---|---|---|---|
| 5,056,893 A | 10/1991 | Holz et al. | |
| 5,276,380 A | 1/1994 | Tang | |
| 5,644,327 A | 7/1997 | Onyskevych et al. | |
| 5,661,531 A | 8/1997 | Greene et al. | |
| 5,673,091 A | 9/1997 | Boisdron et al. | |
| 5,880,705 A * | 3/1999 | Onyskevych et al. | 345/80 |
| 5,889,568 A | 3/1999 | Seraphim et al. | |
| 5,903,328 A | 5/1999 | Greene et al. | |
| 6,259,838 B1 | 7/2001 | Singh et al. | |
| 6,274,978 B1 | 8/2001 | Roach et al. | |
| 6,614,171 B2 | 9/2003 | Rajeswaran et al. | |
| 6,999,045 B2 * | 2/2006 | Cok | 345/1.3 |
| 2006/0044215 A1 | 3/2006 | Brody et al. | |
| 2006/0055864 A1 | 3/2006 | Matsumura et al. | |
| 2007/0032089 A1 | 2/2007 | Nuzzo et al. | |
| 2009/0088085 A1 * | 4/2009 | Nilsson et al. | 455/76 |

FOREIGN PATENT DOCUMENTS

DE 199 50 839 A1 5/2001

(Continued)

OTHER PUBLICATIONS

Tetsuo Urabe: "Technical Challenge Toward AM-OLED TV", Jan. 1, 2003, IDW, AMD3/OEL4-1 Invited, London, UK, pp. 251-254, XP007016073, p. 253, col. 2, p. 254, col. 3.

Chieh-Wei Chen et al: "An Effective Cathode Structure for Inverted Top-Emitting Organic Light-Emitting Devices", Applied Physics Letters, AIP, American Institute of Physics, Melville, NY, US, vol. 85, No. 13, Jan. 1, 2004, pp. 2469-2471, XP012062672, ISSN: 0003-6951.

(Continued)

*Primary Examiner* — Yong H Sim
*Assistant Examiner* — Randal Willis
(74) *Attorney, Agent, or Firm* — McKenna, Long and Aldridge, LLP.

(57) ABSTRACT

A tiled display comprising: a plurality of display tiles aligned so that they provide the emissive image area; each display tile including: a plurality of light-emitting pixels arranged in groups of pixels; a plurality of sequentially arranged pixel drive circuits and each pixel drive circuit being electrically connected to a particular group of pixels for controlling the light emission of such pixels; one or more signal communication line(s) for providing data for controlling the operation of each pixel drive circuit; and each pixel drive circuit controlling the light emission of its corresponding group of pixels and providing information to the next sequential pixel drive circuit to cause such next sequential pixel drive circuit to respond to its corresponding data to control the operation of its group of light-emitting pixels and repeating this operation until a predetermined number of pixel drive circuits have caused the desired light emission.

15 Claims, 7 Drawing Sheets

FOREIGN PATENT DOCUMENTS

| | | |
|---|---|---|
| EP | 0 732 868 | 12/1996 |
| EP | 1 480 195 A1 | 11/2004 |
| EP | 1 513 060 | 3/2005 |
| EP | 1 513 060 A1 | 3/2005 |
| EP | 1 548 573 A | 6/2005 |
| JP | 2002-311881 | 10/2002 |
| JP | 2002 311881 A | 10/2002 |
| WO | 2005/122285 | 12/2005 |
| WO | 2006/130721 | 12/2006 |

OTHER PUBLICATIONS

Mathews et al, "Manufacturing Microelectronics Using 'Lase-and-Place'", Photonics Spectra, Oct. 2007, pp. 70-74.

* cited by examiner

TILED ELECTRONIC DISPLAY

FIELD OF THE INVENTION

The present invention relates to electronic displays, and in particular to large electronic displays.

BACKGROUND OF THE INVENTION

Electronic display devices, such as liquid crystal (LC) displays and organic light-emitting diode (OLED) displays, are becoming common and even preferred over older cathode-ray displays, as a result of the electronic displays' thinness, reduced weight, and reduced power consumption relative to older displays. They have also allowed the development of larger area displays. This has led to a demand for even larger displays, e.g. for televisions. However, manufacturing difficulties with larger displays means that the cost of making a display of this sort increases rapidly with the size.

Electronic displays are commonly manufactured by providing control circuitry (e.g. a pattern of thin-film transistors, or TFTs, which can comprise one or several layers) and light-emitting materials on a substrate, such as a sheet of glass. Other materials can be provided as well, such as patterned color filters, or layers of liquid crystals in LC displays. Such displays require multiple coating and patterning steps to achieve the final product.

As the display size increases, such processes become more difficult. One problem is that as the display is made larger, the apparatus necessary for the coating and patterning steps also becomes larger and more expensive, and requires greater area, often in a cleanroom, which adds further expense. In addition, a defect in manufacturing that makes a display unusable is more expensive, because it involves the loss of a larger, more expensive substrate. A defect rate that would be acceptable for a small display can be intolerable for a much larger display. This can lead to tighter controls in manufacturing, which also adds to the cost.

One approach to improve manufacturability of large displays has been to produce smaller display units which are then joined together in a tiled display. Examples include U.S. Pat. Nos. 5,661,531; 5,056,893; 5,673,091; and 5,903,328. While attractive for ease of manufacturing, tiled displays create other problems, such as access to proper control of image display. To properly display images, electronic displays require data and control signals present in two dimensions, e.g. data signals on column connections and control signals present on row connections. In a 2×2 array of rectangular tiles, each of the tiles has one edge exposed in each dimension, allowing such connections, for example as shown in FIG. 1A of U.S. Pat. No. 5,903,328. However, connecting a tiled array in this manner doubles the necessary connections to control the display, when compared to a single-unit display. Further, for large arrays requiring more than a 2×2 array of tiles (for example 2×3), this method of edge connection is not feasible, as some of the tiles will only have one side, or even no sides, exposed.

Brody et al., in US Patent Application 2006/0044215 A1, teach a method of overcoming this limitation in which tiles can be overlapped to create larger displays. A disadvantage of this method, however, is that the tiles must now include tile-to-tile connections. This requirement necessarily increases the complexity and difficulty of manufacturing each tile.

U.S. Pat. No. 5,889,568 describes various approaches for making tiled displays having larger numbers of tiles. For example, each tile may be formed as a module and connected on at least two edges (for example a row edge and a column edge). Alternately, tile to tile connections can be formed. Since space for the connections to the tiles and sealing of the tiles must be hidden between emitting pixel areas, this approach is only valid for displays with very large pixel sizes or low resolution.

Boisdron et al., in U.S. Pat. No. 5,673,091, teach methods to reduce or hide the space required for the seal regions of the tiles and the electrical connections to the tiles or between the tiles within the display area in an effort to improve display quality. However these methods add expense and manufacturing complexity.

Cok, in U.S. Pat. No. 6,999,045, teaches that the display file elements can be connected in series or parallel. However, within-tile communications are handled in a conventional manner, thereby limiting the maximum size of a single tile. Furthermore this approach still requires hiding the tile-to-tile electrical connections or seal regions within the display, such as by optical wave guide, for tiled arrays greater than 2×2.

Matsumura et al., in US 2006/0055864 A1, teach a method for the assembly of a display using semiconductor ICs affixed within the display for controlling pixel elements where the embedded transistors in the ICs replace the normal functions performed by the TFTs of prior art displays. The device of Matsumura et al. is driven by a conventional orthogonal array of row-control wires and column data wires, and as such does not facilitate tiling or the fabrication of long or large displays.

The goal of tiling multiple smaller displays remains desirable for production of large-area, low-cost displays. Thus, despite the advances in manufacturing larger tiled displays, there remains a need for improved large displays with greater ease of manufacturing.

SUMMARY OF THE INVENTION

It is therefore an object of the present invention to provide a large display that can be more readily manufactured.

This object is achieved by a tiled display having an emissive image area that causes light emission, comprising:

a. a plurality of display tiles aligned so that they provide the emissive image area; each display tile including:
  i. a plurality of light-emitting pixels arranged in groups of pixels in the emissive area;
  ii. a plurality of sequentially arranged pixel drive circuits and each pixel drive circuit being electrically connected to a particular group of pixels for controlling the light emission of such pixels;
  iii. first means including one or more signal communication line(s) for providing data for controlling the operation of each pixel drive circuit; and
  iv. each pixel drive circuit receiving data from the first means for controlling the light emission of its corresponding group of pixels and providing information to the next sequential pixel drive circuit to cause such next sequential pixel drive circuit to respond to its corresponding data to control the operation of its group of light-emitting pixels and repeating this operation until a predetermined number of pixel drive circuits have caused the desired light emission from the emissive area.

ADVANTAGES

It is an advantage of this invention that it allows a large display to be created from many smaller tiles, allowing simpler and less expensive manufacturing of large electronic displays. It is a further advantage of this invention that any desired number of tiles can be used. It is a further advantage of this invention that tiles, which are far less expensive than a full display, can be discarded if imperfect, and a display prepared from only known good tiles, thus improving manufacturing yield and reducing cost of displays. It is a further advantage of this invention that tile-to-tile connection is not required, thus reducing complexity and manufacturing difficulty of the tiles. It is a further advantage of this invention that all of the control and data connections are on one side of the display, simplifying control of the display. It is a further advantage of this invention that no electrical connections to the tiles are required within the display area, thereby providing high image quality. It is a further advantage of this invention that it can be used in applications wherein it is desired that the display have a shape that is not flat. It is a further advantage of this invention that individual drive circuits can be all the same at the time of their fabrication; without the need for unique ID or address information.

Because features such a layer thicknesses are frequently in the sub-micrometer range, the drawings are sized for clarity of illustration of invention features, rather than for dimensional accuracy.

DETAILED DESCRIPTION OF THE INVENTION

Figure 1:
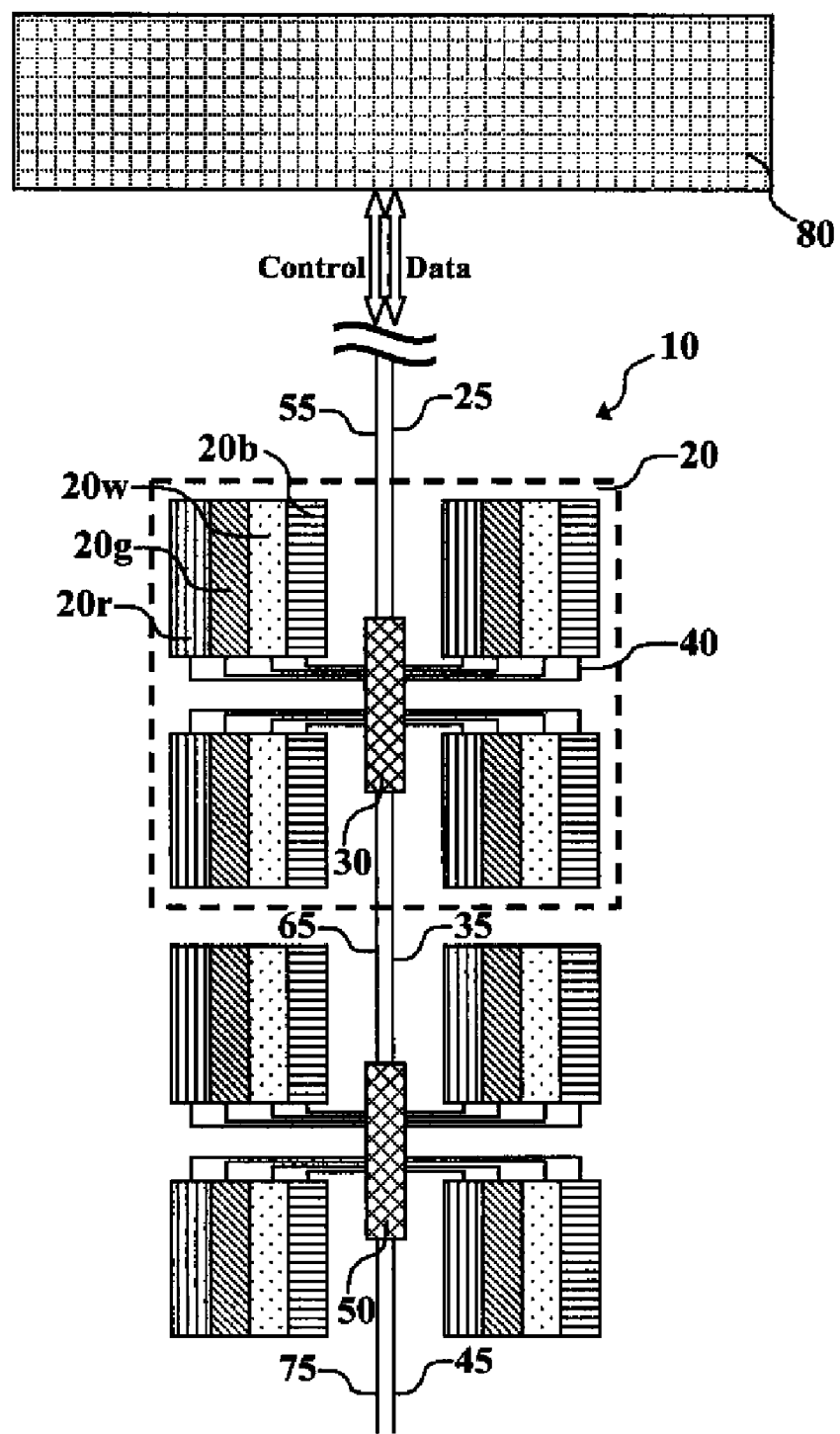
FIG. 1 shows a plan view of one embodiment of a display of this invention.

Turning now to FIG. 1, there is shown a plan view of one embodiment of a display of this invention. Display 10 can represent an entire display or a portion thereof. Display 10 has an emissive image area that causes light emission. The emissive image area that comprises a plurality of light-emitting pixels, e.g. red light-emitting pixels such as 20$r$, green light-emitting pixels such as 20$g$, blue light-emitting pixels such as 20$b$, and white light-emitting pixels such as 20$w$. The light-emitting pixels can be any form of electronic display, e.g. OLED or LCD, and are not limited to the combinations of colors in this embodiment. The pixels in the emissive area are arranged in groups of pixels, e.g. group of pixels 20. Display 10 includes a plurality of sequentially arranged pixel drive circuits, e.g. pixel drive circuits 30 and 50, and other pixel drive circuits that can be located above pixel drive circuit 30 or below pixel drive circuit 50. The term "sequentially arranged" as used herein means that 1) the pixel drive circuits are so located to form a sequence in space of such drive circuits, e.g. a linear sequence on a support, 2) the pixel drive circuits perform their operations in the same sequence as their spatial location, and 3) all of the pixel drive circuits in a sequence are electrically connected serially in a chain configuration by at least one communication connection. Each pixel drive circuit is thus electrically connected to the next sequential pixel drive circuit. In addition to the at least one communication connection in series, the display can further include parallel communication connections for providing a portion of the data to the pixel drive circuits. The terms "series", "serially", and "parallel" used herein refer to the arrangement of the communication paths to the pixel drive circuits. Each pixel drive circuit is electrically connected to a particular group of pixels, e.g. pixel drive circuit 30 is connected (via electrical connections, e.g. 40) to the pixels of group of pixels 20 so as to control the light emission from those pixels. Pixel drive circuit 30 determines the brightness level of each pixel in group of pixels 20 according to data received, as will be seen. Pixel drive circuit 30 can be, for example, a separately fabricated integrated circuit, and will be described further below. In the embodiments described herein, the data can be represented as either digital data or in the form of analog voltage signals relating to the desired brightness and color of the individual sub-pixels, pixels, or groups of pixels.

Display 10 further includes an apparatus for controlling the operation of pixel drive circuit 30. This control apparatus includes one or more signal communication lines, e.g. data line 25 and control line 55, and a control device, e.g. data source 80, which can be external to display 10, for providing data onto data line 25 and control signals onto control line 55. Data source 80 is an example of a control device for providing data for controlling the operation of the pixel drive circuits and their corresponding pixels. Data source 80 can be a device known in the art to be useful for controlling displays, such as a processor or an application-specific integrated circuit. The first pixel drive circuit is thus electrically connected to the control device and receives data from the control device. The provided data and signals control the operation of the pixel drive circuits. Other data and control lines can be connected to the sequentially arranged pixel drive circuits. At least one of the signal communication lines, such as control line 55 and subsequent control lines (e.g. control lines 65 and 75), is electrically connected in series with the sequentially arranged pixel drive circuits. Other signal communication lines, e.g. data line 25 and subsequent data lines, can be series or parallel signal communication lines for providing a portion of the data for controlling the operation of each pixel drive circuit. The control device provides sequential data on data line 25 for controlling the emission of the pixels of display 10 by providing data first for all the pixels connected to pixel drive circuit 30, then for all the pixels connected to pixel drive circuit 50, and sequentially for each successive pixel drive circuit. In one embodiment of this invention, information is provided to pixel drive circuit 30 by providing a signal on control line 55 to cause pixel drive circuit 30 to respond to its corresponding data on data line 25 to control the operation of group of pixels 20. Pixel drive circuit 30 responds to the data and controls the operation of the individual pixels. When the data for all of group of light-emitting pixels 20 has been provided, pixel drive circuit 30 provides information to the next sequential pixel drive circuit, e.g. to pixel drive circuit 50 via a signal on control line 65. The information causes pixel drive circuit 50 to respond to its corresponding data on data line 35 to control the operation of its group of light-emitting pixels. When pixel drive circuit 50 is complete, it provides information to the next sequential pixel drive circuit, e.g. via a signal on control line 75, that the corresponding data is available on data line 45. This process is repeated until a predetermined number of pixel drive circuits have caused the desired light emission from the emissive area of display 10.

It is an advantage of this invention that the operation of the final pixel drive circuit need be no different from the others, thereby simplifying manufacturing. The final pixel drive circuit will act to signal to a successive pixel drive circuit; however, no successive pixel drive circuit will be available to receive the signal. Further, the data source will stop sending data, ending the data transmission sequence. The data source will then place a signal on the control line to the first pixel drive circuit to indicate that a new sequence of data transmission is beginning.

Display 10 also includes other lines commonly used in such displays, such as power and ground lines. These have been omitted for clarity of illustration of the salient features of this invention. Control lines 55, 65, and 75 are constructed to be non-continuous, that is, a series connection with the pixel drive circuits, such that each pixel drive circuit controls the subsequent control line. Data lines 25, 35, 45, and any subsequent lines, can form a continuous line from the top to the bottom of display 10 (parallel connection) or can be separate lines wherein each pixel drive circuit also forms part of the data path (series connection). In the latter case, the external controller need not provide a data signal of sufficient gain to pass through the entire display, because each pixel drive circuit can provide the passed-through signal with a gain increase. Also in the latter case, the pixel drive circuit can be configured to pass the data to subsequent pixel drive circuits at all times, or only after it has received the data for its own corresponding group of pixels.

The above represents one embodiment of the process of pixel drive circuit 30 providing information to next sequential pixel drive circuit 50 that causes pixel drive circuit 50 to respond to its corresponding data. It will be understood that other embodiments are possible. In some alternate embodiments, it is not necessary to have both a control line and a data line. In these embodiments, a single discontinuous signal communication line (e.g. data lines 25, 35, etc.) connected in series with the pixel drive circuits will suffice. In one such alternate embodiment, pixel drive circuit 30 responds to the first data it receives, but does not pass data to the next pixel drive circuit 50, until it has finished responding to its data. It then continues to pass data, while counting the incoming data until the data equal to the number of rows has been received. This repeats for each pixel drive circuit, each sequential circuit being delayed relative to the prior pixel drive circuit. Thus, each pixel drive circuit will be first activated simply by receiving data. In another such alternate embodiment with a single discontinuous communication line, pixel drive circuit 30 can set one or more control bits in the data stream to indicate that the data is meant for pixel drive circuit 50. This embodiment has the advantage that the external control device can set the control bit(s) to indicate to the first pixel drive circuit in the sequence that it must process the data, thus restarting the data delivery sequence.

The above embodiments utilize control signals during display operation to coordinate receiving of the data. In another embodiment, signals on the control lines can be utilized prior to commencing display operation. In this embodiment, the control lines (55, etc.) have series connections, while the data lines (25, etc.) have parallel connections with the integrated circuits. In this embodiment, pixel drive circuit 30 includes registers for storing an address. Before display operation—which can be at every power-on for the display, or one time only when the display is manufactured—a signal is placed on control line 55 that pixel drive circuit 30 is to store a sequence identification number indicating its sequence or address in the display. It in turn places a signal on control line 65 that pixel drive circuit 50 is to store an incremented number indicating its sequence, and so forth to the bottom of the display. Subsequently during display operation, data is placed onto parallel data line 25. The data can be transmitted with address information indicating the appropriate pixel drive circuit to process the data. Therefore, each pixel drive circuit will respond only when its previously stored sequence identification number appears in the data stream. Alternatively, the pixel drive circuit itself can determine when to process the data by waiting until an appropriate quantity of data based on its predetermined sequence identification number has been transmitted to lower-numbered pixel drive circuits.

The embodiment shown in FIG. 1 can be repeated one or more times to continue the sequence shown and increase the length of the display. The embodiment can be repeated one or more times in parallel on the same physical display to increase the width of the display.

Figure 2:
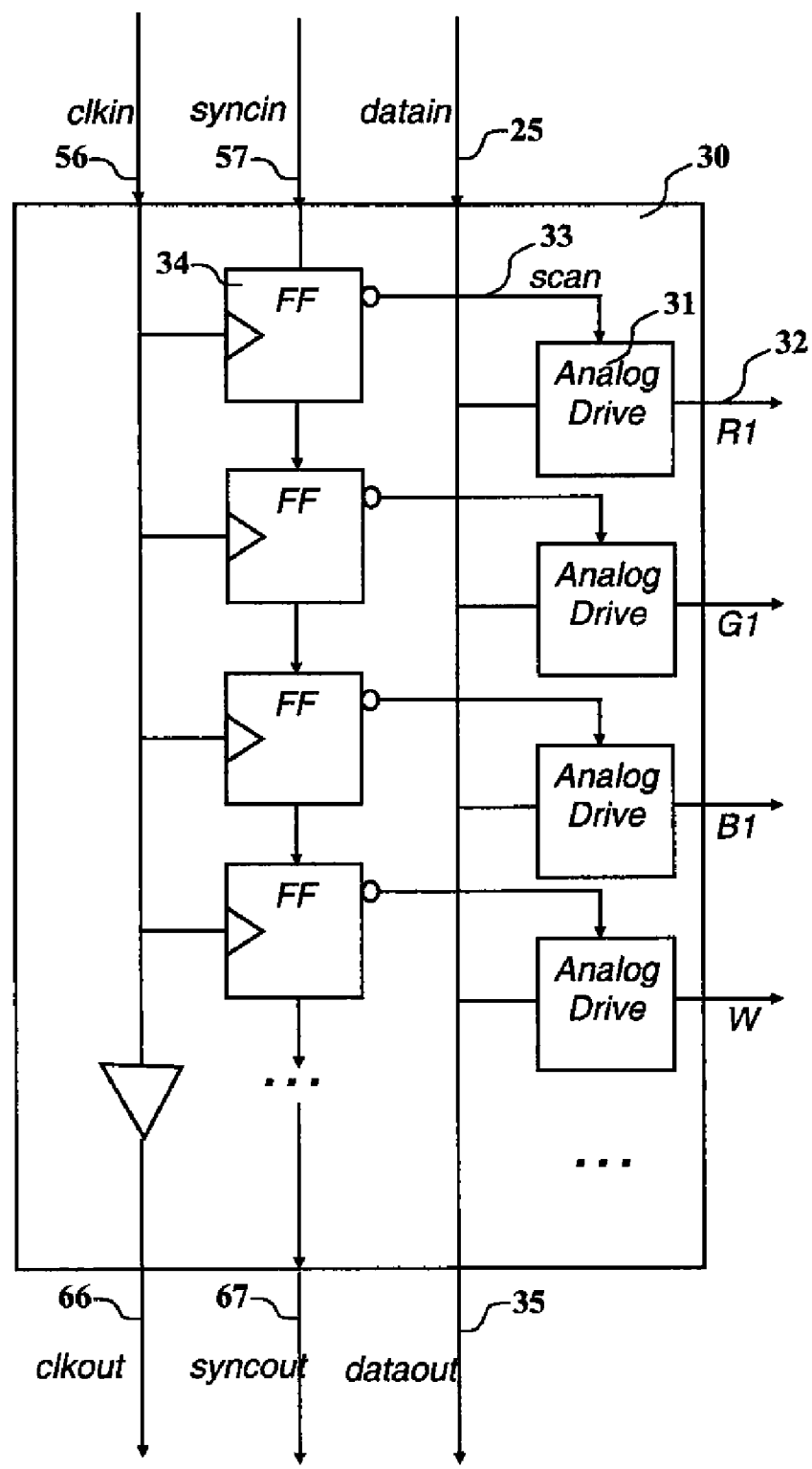
FIG. 2 shows a block diagram for a pixel drive circuit that can be used in the practice of this invention.
Figure 3:
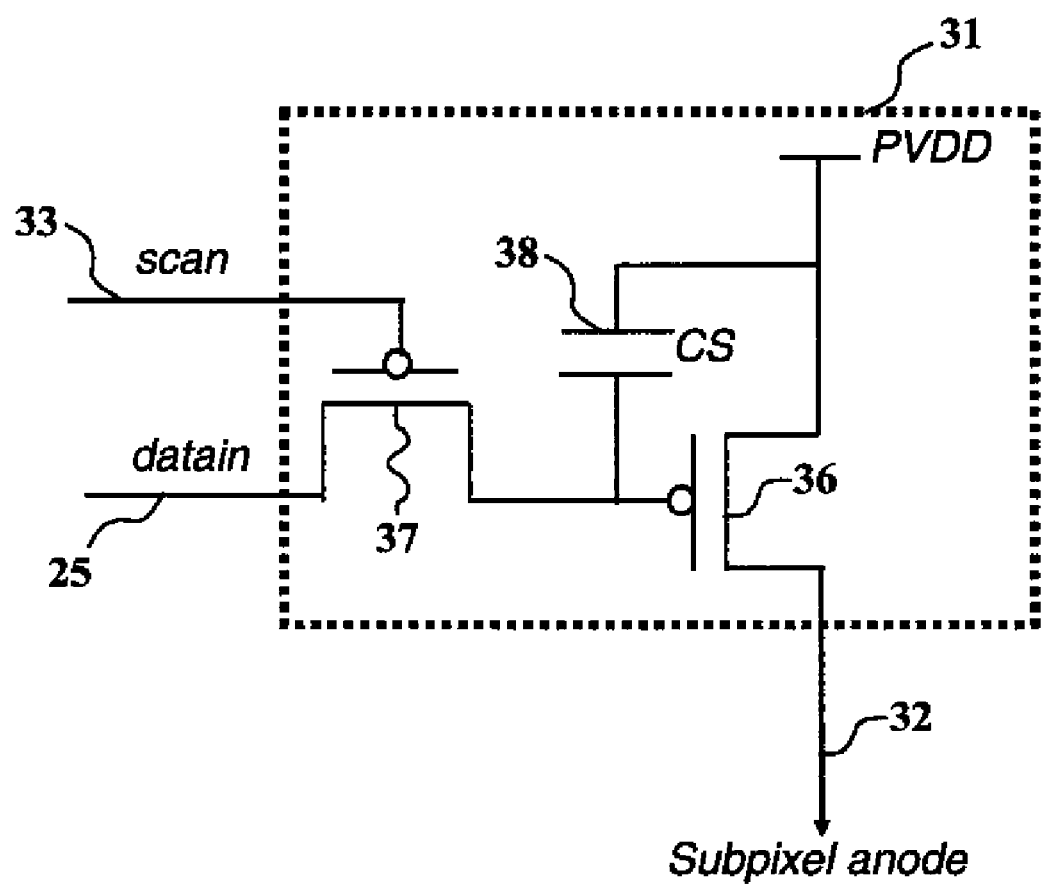
FIG. 3 shows a circuit schematic for a drive circuit contained within the pixel drive control circuit.

Pixel drive circuit 30 can be an integrated circuit that is separately fabricated and later mounted to display 10. One embodiment of pixel drive circuit 30 useful in this invention is shown in FIG. 2. In this circuit embodiment, nominal control line 55 (see FIG. 1) actually comprises two lines: clock in 56 and sync in 57; similarly, control line 65 (see FIG. 1) comprises clock out 66 and sync out 67. Clock in 56 and sync in 57 control when data line 25 programs a subpixel driven by the pixel drive circuit. The digital portion of the circuit is a shift register comprised of flip flops (FF) 34. Current is supplied to subpixel anode 32 by analog drive circuit 31. One embodiment of analog drive circuit 31 is shown in FIG. 3. The voltage signal corresponding to the desired pixel luminance is stored on storage capacitor 38, which regulates the current through drive transistor 36 to control the light emission of the pixel. Scan transistor 37 allows the voltage on data line 25 to be stored on storage capacitor 38 when scan signal 33 is enabled. The circuitry in pixel drive circuit 30 can optionally include circuits known in the art to compensate for thermal effects and aging of the display.

Figure 4:
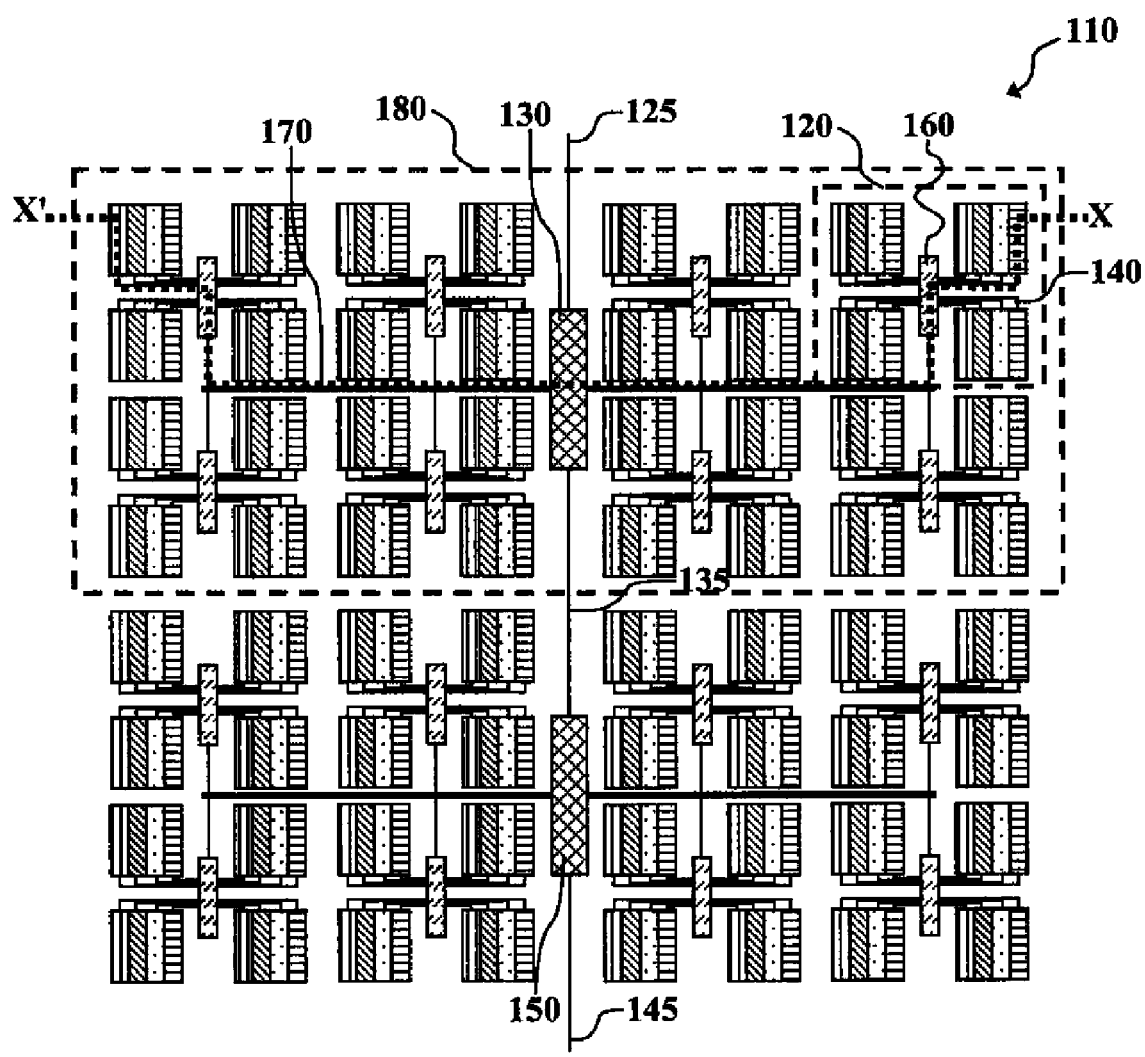
FIG. 4 shows a plan view of another embodiment of a display of this invention.

Turning now to FIG. 4, there is shown a plan view of another embodiment of a display of this invention. In display 110, a pixel drive circuit controls the operation of a larger group of light-emitting pixels, e.g. group of pixels 180. The pixel drive circuit comprises a first integrated circuit 130, one or more second integrated circuits in the area of the corresponding group of pixels, e.g. second integrated circuit 160. First integrated circuits 130 and 150 and second integrated circuits 160 can be separately fabricated and later mounted to display 110. Each second integrated circuit 160 is electrically connected to a first integrated circuit (e.g. 130) via electrical connections 170, and to a group of pixels, e.g. group of pixels 120, via electrical connections 140. For clarity of illustration, connection 170 is represented as a single line, but it will be understood that connection 170 can represent multiple lines as necessary. In this embodiment, integrated circuits 130 and 150 are analogous to pixel drive circuits 30 and 50 of display 10, above, in the function of receiving and sending data via data lines 125, 135, and 145. However, first integrated circuits 130 and 150 do not control the pixels directly. Instead, first integrated circuit 130 distributes its data to one or more separately fabricated second integrated circuits, e.g. second integrated circuit 160, which controls the light emission of its corresponding group of light-emitting pixels, e.g. group of pixels 120. Thus, the first integrated circuits can be considered first-tier or master integrated circuits, while the second integrated circuits can be considered second-tier or slave integrated circuits. An advantage of this arrangement is that first integrated circuit 130 can be designed and optimized for high-speed digital data reception, processing, and transmission, while second integrated circuit 160 can be designed and optimized for higher-power pixel control via analog current drive. Since integrated-circuit manufacturers can provide either of these process types separately, but not easily provide both simultaneously, it is an advantage to separate these functions into different integrated circuit chips. That is, first integrated circuit 130 handles the digital information part embodied in flip flops 34 in FIG. 2, and can be made using a small feature-size process (0.35, 0.18, 0.13 micrometer etc.), with low voltage (5V or 3.3V) digital logic type transistors, while second integrated circuit 160 can include analog drive circuits similar to those of FIG. 2 and can be made using a larger feature-size process (0.5 micrometer, etc.) with high voltage type transistors (15V or 18V type).

In this embodiment, the data lines function for both data distribution (as in display 10) and pixel drive circuit control (as the control lines in display 10). This can be achieved by the use of one or more extra information bits in the data stream, such that both data sequences and command sequences are possible, as described above. Thus, a command sequence to first integrated circuit 130 via data line 125 from an external controller will cause first integrated circuit 130 to receive data that it distributes to its corresponding second integrated circuits. When it has finished, it sends a command sequence to first integrated circuit 150 and passes along the data that first integrated circuit 150 then uses to control the operation of its corresponding pixels. However, separate data and control lines, as in display 10, can be used in this embodiment as well.

Figure 5A:
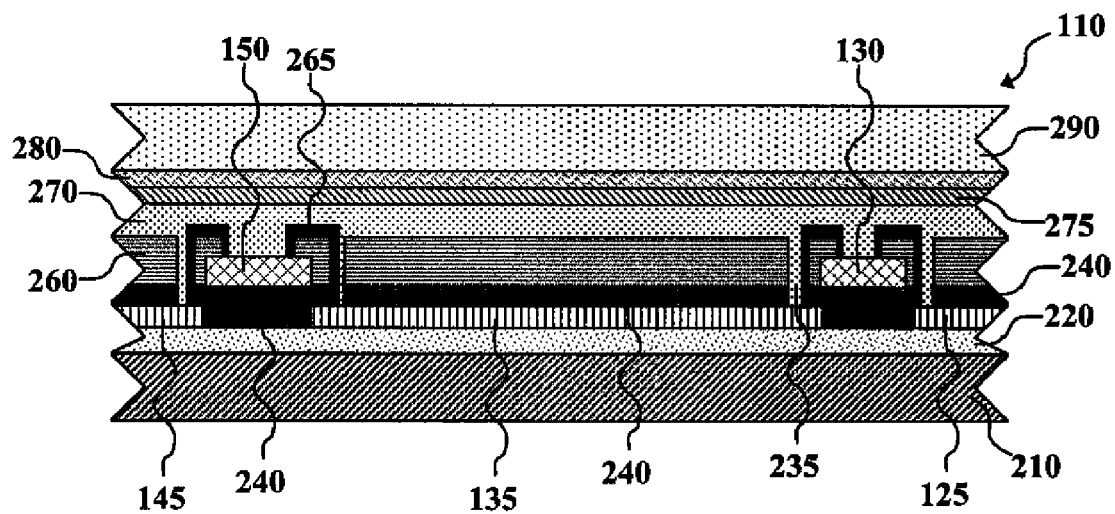
FIGS. 5A and 5B show cross-sectional views of one embodiment of a display of this invention as represented by FIG. 4.
Figure 5B:
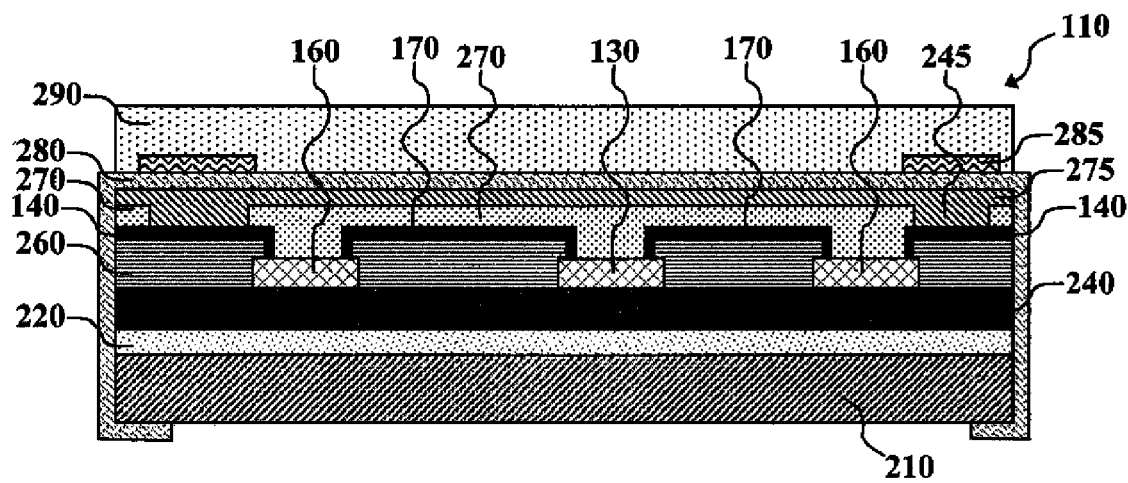

Turning now to FIGS. 5A and 5B, there are shown cross-sectional views of one embodiment of a display of this invention as represented by FIG. 4. FIG. 5A is a direct cross-section of display 110 from FIG. 4 along the straight line from data line 125 to data line 145. Display 110 can be formed on a substrate 210. Substrate 210 is desirably a flexible material, including metal foil, plastic, or combinations of metal and plastic. More convention glass materials can also be employed as the substrate. In one useful embodiment, substrate 210 is a metal foil such as aluminum or stainless steel. In such a case, the substrate is opaque to light transmission, and light will therefore be emitted from the side of display 110 opposite to substrate 210. When substrate 210 is a metal foil, insulating layer 220 is placed over it. Patterned electrical connections are placed over insulating layer 220. The electrical connections can include signal data lines and control lines as described above, e.g. data lines 125, 135, and 145, as well as other electrical connections necessary or useful in electronic displays, such as power and ground lines (although one of these can be performed by substrate 210 if it is a metal foil), timing or handshaking connections, and circuit test lines. Patterning of this and other layers described herein can be accomplished by methods well-known to those skilled in the art, including, but not limited to, conventional deposition and photolithography, through-mask (shadow mask) deposition, integral shadow masking as described in U.S. Pat. No. 5,276,380 and EP 0 732 868, laser ablation, selective chemical vapor deposition, and digital lithography.

An adhesive 240 is placed over the layer of electrical connections. Integrated circuits, which have been described above, are mounted on substrate 210 by adhesive 240, and via holes, e.g. via 235, are formed where necessary to for connection to the layer of electrical connections. Integrated circuits, e.g. first integrated circuits 130 and 150, can be fabricated as conventional integrated circuits together in quantity on a wafer as is common in the art and placed separately onto adhesive 240 by methods that have been described by Nuzzo et al. in US 2007/0032089 A1, WO 2005/122285 A3, and WO 2006/130721 A2. Other methods of attaching integrated circuits to a display substrate are described by Matsumura et al. in US 2006/0055864, and by Mathews et al., "Manufacturing Microelectronics Using 'Lase-and-Place'", Photonics Spectra, October 2007, pp. 70-74.

Patterned insulating layer 260 provides insulation for the electrical connection layer except at desired locations, e.g. via 235. Patterned wire layer 265 then provides electrical connections between the integrated circuits and the electrical connection layer. Over this is an insulating layer 270, which will be shown to be a patterned insulating layer, and OLED layers 275.

FIG. 5B is a schematic cross-sectional view of display 110 of FIG. 4 from X to X'. Specifically, the cross-section in FIG. 5B is from X to a colored pixel, to corresponding connection 140, to corresponding second integrated circuit 160, to corresponding connection 170, to first integrated circuit 130, and via corresponding structures to X'. First integrated circuit 130 and second integrated circuit 160 are mounted on substrate 210 by adhesive 240. Patterned wire layer 265, as described above, also includes previously described connections 170 between first and second integrated circuits 130 and 160, respectively, and connections 140 between second integrated circuits 160 and the light-emitting pixels 245. The patterned wire layer can thus serve as the lower electrode (e.g. anode) of the OLED layer 275, or another electrode can be optionally added. OLED layers 275 can include layers commonly used in such devices, e.g. hole-transporting layers, electron-transporting layers, light-emitting layers, and other layers well-known in the art. Thus, the pixels in this embodiment comprise OLED devices. Over OLED layers 275 is an upper electrode, which in this embodiment is cathode 280. In one embodiment wherein all or part of substrate 210 is electrically conductive, cathode 280 wraps around the edges of display 110, so that the substrate electrically contacts the electrode and can conduct electricity to or from the light-emitting pixels. The display is top-emitting, such that light is emitted from the side opposite substrate 210, that is, through cathode 280 and transparent cover 290.

A full color device can be achieved using a common broadband layer (e.g. a white OLED layer) and color filters 285. The color filters can be preprinted onto a transparent cover 290, which can comprise glass or plastic. In another embodiment, the color filters can be formed on top of cathode 280. In this embodiment, transparent cover 290 can be attached in some embodiments, or can be left off if the display is to be placed against a display support as described below. In another embodiment, the color filters are formed on a display support, which will be described below, to which one or more display elements can be aligned and affixed.

Full color OLED devices can also be formed by using a shadow mask for depositing red-, green-, and blue-emitting OLED materials selectively over different pixels. In this case, the display can be covered with a transparent cover 290, but color filters are not needed. Alternately, transparent cover 290 can be replaced with a thin-film encapsulation layer formed over the emissive display.

It will be understood that FIG. 5B is simplified for clarity of illustration. Display 110 will typically have many more pixels and color filters across a cross-section.

Figure 6:
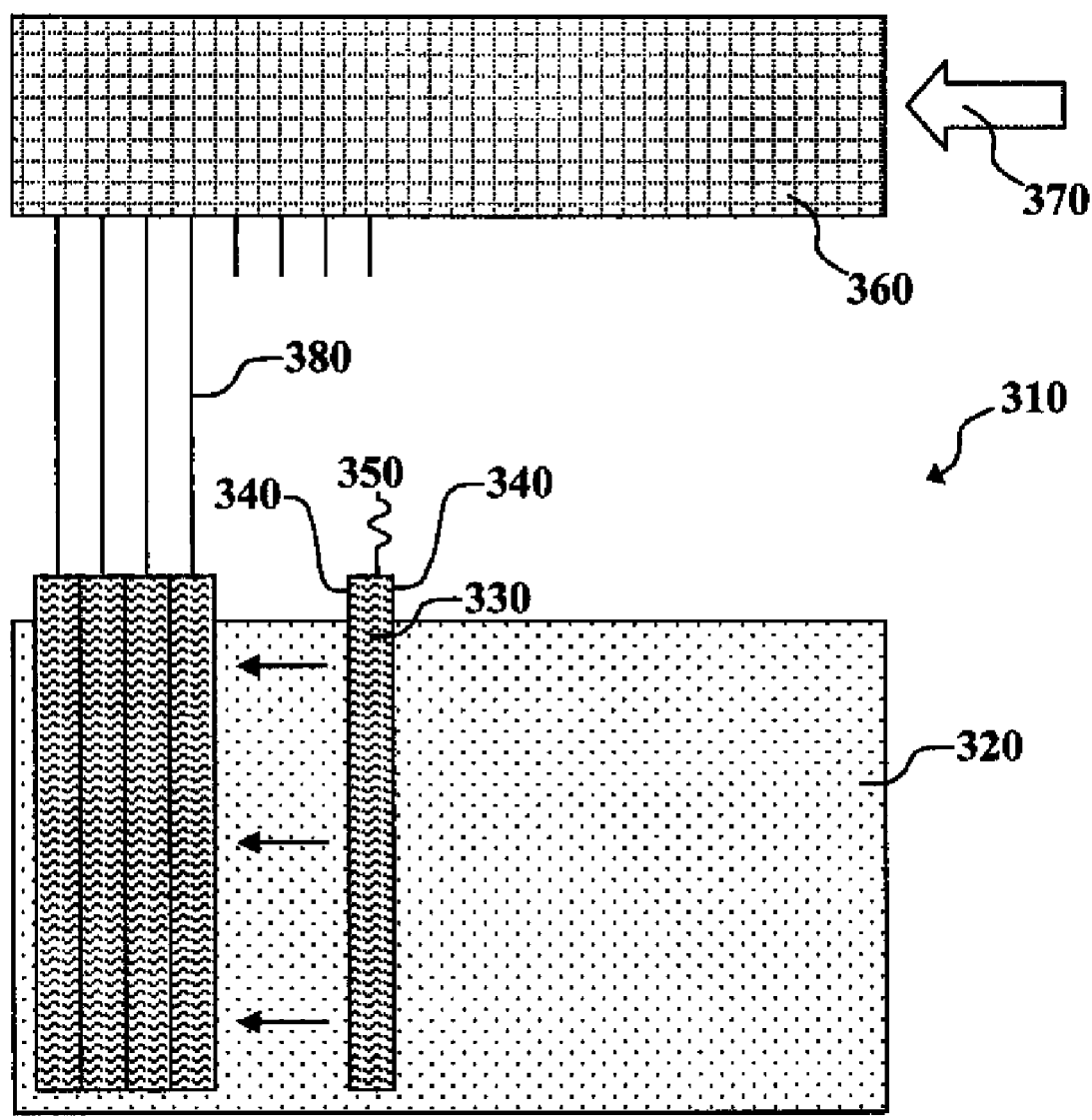
FIG. 6 shows a plan view of an embodiment of a tiled display of this invention incorporating multiple display tiles of this invention.

Turning now to FIG. 6, there is shown a plan view of an embodiment of a tiled display of this invention incorporating multiple tiles of this invention. Tiled display 310 includes a plurality of display tiles 330, which include first edges 340 that are parallel to each other, and second edge 350 perpendicular to first edges 340. First edges 340 are longer than second edges 350. Each display tile 330 can be constructed as described above for displays 10 and 110; that is, each display tile 330 includes a substrate as described above, a plurality of light-emitting pixels formed on the substrate and arranged in groups of pixels as described above, a plurality of sequentially arranged pixel drive circuits as described above, and one or more signal communication lines as described above. The signal communication lines, and thus the sequence of pixel drive circuits, are arranged parallel to first edges 340. The sequentially arranged pixel drive circuits can include a series of integrated circuits, as shown in FIG. 1, mounted on the substrate. Alternatively, the sequentially arranged pixel drive circuits can include a series of first integrated circuits mounted on the substrate, each of which is electrically connected to one or more second integrated circuits mounted on the substrate, as shown in FIG. 4. The sequentially arranged pixel drive circuits operate as described above. Each pixel drive circuit of a display tile controls the light emission of its corresponding group of pixels, and provides information to the next sequential pixel drive circuit on display tile 340 to cause the next sequential pixel drive circuit to respond to its corresponding data to control the operation of its corresponding group of light-emitting pixels. Display tiles 330 are aligned on display support 320 along first parallel edges 340 so that they provide the tiled display's emissive image area, which comprises the combined emissive areas of all the display tiles.

Display tiles 330 can be aligned and affixed with the emitting-side face to display support 320 using an adhesive. The display support 320 is light-transmissive for viewing the emission through the support. Transparent glass or plastic can be employed and display support 320 can be rigid or flexible.

In embodiments where it is desired to make a full-color display using a single broadband emitter (e.g. a white-light-emitting OLED), display support 320 can be preprinted with color filters and alignment marks, eliminating the need for a separate color filter substrate. Display tiles 330 are then lined-up with the alignment marks so that the light emitting areas are aligned with the color filters, and display tiles 330 are affixed to display support 320 with adhesive. If encapsulation is required and the encapsulation of the individual display tiles (e.g. by transparent cover 290) is not sufficient for the required display lifetime, tiled display 310 can be further sealed by covering the non-emitting side of the display tiles with a water and oxygen impermeable cover such as glass or metal. The individual display tiles 330 can extend beyond the edge of display support 320, as shown, or can be terminated inside the area of the support.

Tiled display 310 further includes data source 360, which is separate from display tiles 330. Data source 360 is an example of a control device for providing data for controlling the operation of the pixel drive circuits and their corresponding pixels. Data source 360 can be part of display support 320 or can be a separate entity. Data source 360 receives image information 370, e.g. pixel intensity, and produces the data to control the light emission from the pixels of each display tile 330 by providing data onto the signal communication lines as described above. The signal communication lines of display tiles 330 are connected through second edge 350 to data source 360 by connection 380. Each connection 380 represents one or more lines between data source 360 and display tiles 330, wherein such lines can include data lines, control lines, power and ground lines, handshaking lines, data read-out lines, or other lines necessary for display control. Connections 380 can be attached to one or both second edges 350; however, connection at a single second edge is desirable to allow lower-cost driving methods using a single data source 360. Data source 360 can be a device known in the art to be useful for controlling displays, such as a processor or an application-specific integrated circuit.

Figure 7:
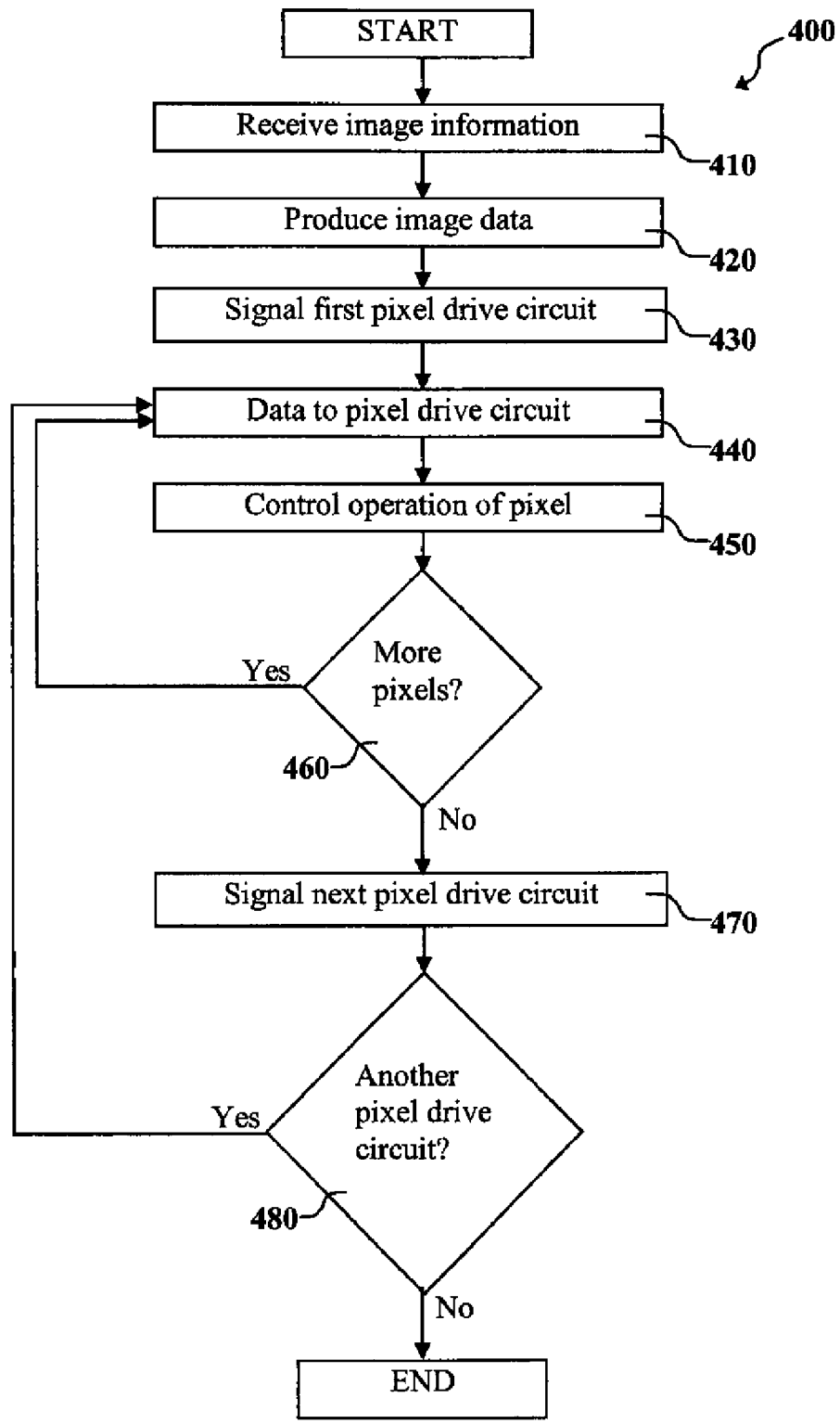
FIG. 7 shows a block diagram of a method of using a display of this invention.

Turning now to FIG. 7, and referring also to FIG. 1 and FIG. 6, there is shown a block diagram of a method of using a display of this invention. At the start of method 400, image information 370 is received by data source 360 (Step 410), and data source 360 produces data (Step 420) that will be used to drive the pixel drive circuits and pixels of the display. Data source 360 provides information to the first pixel drive circuit (Step 430), e.g. by providing a signal on control line 55 to first pixel drive circuit 30, to begin control of its corresponding group of pixels. Data is then provided to the pixel drive circuit (Step 440), e.g. over signal data line 25, and the pixel drive circuit uses the data to control pixels in its corresponding group of pixels (Step 450). If there are more pixels in the corresponding group (Step 460), Steps 440 and 450 are repeated as necessary. When there is no more data for pixel drive circuit 30 and its corresponding group of pixels (Step 460), pixel drive circuit 30 provides information to the next sequential pixel drive circuit, e.g. via a signal over control line 65 (Step 470), for the next pixel drive circuit to respond to its corresponding data to control the operation of its group of light-emitting pixels. If there is a next sequential pixel drive circuit (Step 480), Steps 440 to 470 are repeated as necessary. If there is no further pixel drive circuit (Step 480), the process ends. The last sequential pixel drive circuit will therefore include the ability to signal a further pixel drive circuit. However, there will be no further pixel drive circuit to respond to the signal, and data source 360 will not provide any further data. Instead, data source 360 will restart process 400 with new information (Step 410), produce new image data (Step 420), and signal the first pixel drive circuit to begin accepting data again (Step 430). In a tiled display, e.g. tiled display 310, the above process is used for each display tile.

In an alternative embodiment, if there are no further pixel drive circuits at the bottom of the tile, the last pixel drive circuit can signal the first pixel drive circuit to start responding to data again. However, this embodiment would require an extra line that runs a predetermined length in each display tile, and is thus a less-desirable embodiment.

The invention has been described in detail with particular reference to certain preferred embodiments thereof, but it will be understood that variations and modifications can be effected within the spirit and scope of the invention.

PARTS LIST 10 display
20 group of pixels
20r red pixel
20g green pixel
20w white pixel
20b blue pixel
25 data line
30 pixel drive circuit
31 analog drive circuit
32 subpixel anode
33 scan signal
34 flip flop
35 data line
36 drive transistor
37 scan transistor
38 storage capacitor
40 connection
45 data line
50 pixel drive circuit
55 control line
56 clock in
57 sync in 65 control line
66 clock out
67 sync out
75 control line
80 data source
110 display
120 group of pixels
125 data line
130 first integrated circuit
135 data line
140 connection
145 data line
150 first integrated circuit
160 second integrated circuit
170 connection
180 group of pixels
210 substrate
220 insulating layer
235 via
240 adhesive
245 pixel
260 patterned insulating layer
265 patterned wire layer
270 patterned insulating layer
275 OLED layers
280 cathode
285 color filter
290 transparent cover
310 tiled display
320 display support
330 display tile
340 first edge
350 second edge
360 data source
370 image information
380 connection
400 method
410-470 steps

The invention claimed is:

1. A tiled display having an emissive image area that causes light emission, comprising:
 a. a plurality of display tiles aligned so that they provide the emissive image area; each display tile including:
  i. a plurality of light-emitting pixels arranged in groups of pixels in the emissive image area;
  ii. a plurality of sequentially arranged pixel drive circuits and each pixel drive circuit being electrically connected to a particular group of pixels for controlling the light emission of such pixels;
  iii. a data source that is separate from the display tiles and configured to receive image information and to produce data, the data source including a plurality of parallel signal communication line(s) that provide the data for controlling the operation of each pixel drive circuit and one or more first in-series signal communication lines so as to provide information to the first one of the sequentially arranged pixel drive circuits; and
  iv. each pixel drive circuit being configured to:
   receive, via the plurality of parallel communication lines, a portion of the data from the data source so as to control the light emission of its corresponding group of pixels,
   provide, via one or more second in-series communication lines, information to the next sequential pixel drive circuit to cause such next sequential pixel drive circuit to respond to its corresponding data to control the operation of its group of light-emitting pixels, and
   repeat this operation until a predetermined number of pixel drive circuits have caused the desired light emission from the emissive area,
  wherein each display tile includes first edges which are parallel to each other and a second edge perpendicular to the first edges,
  wherein the sequence of pixel drive circuits of each display tiles is aligned along the first edges,
  wherein the plurality of parallel signal communication lines and the one or more first in-series communication lines are connected through the second edge to the data source, and
  wherein each display tile includes its own substrate.

2. The tiled display of claim 1 wherein the first edges are longer than the second edges.

3. The tiled display of claim 1 wherein each pixel drive circuit includes a separately fabricated first integrated circuit mounted on said substrate and electrically connected to said plurality of parallel signal communication line(s) and the next sequential pixel drive circuit.

4. The tiled display of claim 3 wherein the first integrated circuit receives data from said plurality of parallel signal communication line(s) and further including a separately fabricated second integrated circuit mounted on said substrate and electrically connected to the first integrated circuit and its corresponding group of light-emitting pixels for controlling light emission.

5. The tiled display of claim 1 wherein each pixel comprises an OLED.

6. The tiled display of claim 1, wherein the substrate includes a metal.

7. The tiled display of claim 6 wherein the metal substrate conducts electricity to or from the light-emitting pixels.

8. The tiled display of claim 1 each tile further including a substrate where light is emitted from the side opposite the substrate.

9. A display having a plurality of tiles and causing light emission from an emissive image area, each tile comprising:
 a. a plurality of light-emitting pixels arranged in groups of pixels in the emissive image area;
 b. a plurality of sequentially arranged pixel drive circuits and each pixel drive circuit being electrically connected to a particular group of pixels for controlling the light emission of such pixels;
 c. a data source that is separate from the display tiles and configured to receive image information and to produce data, the data source including plurality of parallel signal communication line(s) that provide the data for controlling the operation of each pixel drive circuit and one or more first in-series signal communication lines so as to provide information to the first one of the sequentially arranged pixel drive circuits; and
 d. each pixel drive circuit being configured to:
  receive, via the plurality of parallel communication lines, a portion of the data from the data source so as to control the light emission of its corresponding group of pixels,
  provide, via one or more second in-series communication lines, information to the next sequential pixel drive circuit to cause such next sequential pixel drive circuit to respond to its corresponding data to control the operation of its group of light-emitting pixels, and repeat this operation until a predetermined number of pixel drive circuits have caused the desired light emission from the emissive area, wherein each display tile includes first edges which are parallel to each other and a second edge perpendicular to the first edges, wherein the sequence of pixel drive circuits of each display tiles is aligned along the first edges, wherein the plurality of parallel signal communication lines and the one or more first in-series communication lines are connected through the second edge to the data source, and wherein each display tile includes its own substrate.

10. The display of claim 9 wherein each pixel drive circuit includes a separately fabricated first integrated circuit mounted on said substrate and electrically connected to said plurality of parallel signal communication line(s) and the next sequential pixel drive circuit.

11. The display of claim 10 wherein the first integrated circuit receives data from said plurality of parallel signal communication line(s) and further including a separately fabricated second integrated circuit mounted on said substrate and electrically connected to the first integrated circuit and its corresponding group of light-emitting pixels for controlling light emission.

12. The display of claim 9 wherein each pixel comprises an OLED.

13. The display of claim 9, wherein the substrate includes a metal.

14. The display of claim 13 wherein the metal substrate conducts electricity to or from the light-emitting pixels.

15. The display of claim 9 further including a substrate where light is emitted from the side opposite the substrate.

* * * * *